US008803417B2

(12) United States Patent
Chaji et al.

(10) Patent No.: US 8,803,417 B2
(45) Date of Patent: Aug. 12, 2014

(54) HIGH RESOLUTION PIXEL ARCHITECTURE

(71) Applicant: Ignis Innovation Inc., Waterloo (CA)

(72) Inventors: Gholamreza Chaji, Waterloo (CA);
Vasudha Gupta, Cambridge (CA);
Arokia Nathan, Cambridge (CA)

(73) Assignee: Ignis Innovation Inc., Waterloo, Ontario (CA)

( * ) Notice: Subject to any disclaimer, the term of this patent is extended or adjusted under 35 U.S.C. 154(b) by 0 days.

(21) Appl. No.: 13/724,424

(22) Filed: Dec. 21, 2012

(65) Prior Publication Data

US 2013/0112960 A1    May 9, 2013

Related U.S. Application Data

(63) Continuation-in-part of application No. 12/958,035, filed on Dec. 1, 2010, now Pat. No. 8,552,636.

(30) Foreign Application Priority Data

Dec. 1, 2009 (CA) .................................. 2686174

(51) Int. Cl.
*H01L 33/00* (2010.01)
(52) U.S. Cl.
CPC ..................................... *H01L 33/00* (2013.01)
USPC ............................ 313/504; 313/503; 313/512
(58) Field of Classification Search
CPC ....................................................... H01L 33/00
USPC .......................................... 313/504, 506, 113
See application file for complete search history.

(56) References Cited

U.S. PATENT DOCUMENTS

| 3,506,851 A | 4/1970 | Polkinghorn et al. |
| 3,774,055 A | 11/1973 | Bapat et al. |
| 4,090,096 A | 5/1978 | Nagami |
| 4,160,934 A | 7/1979 | Kirsch |
| 4,354,162 A | 10/1982 | Wright |
| 5,153,420 A | 10/1992 | Hack et al. |

(Continued)

FOREIGN PATENT DOCUMENTS

| CA | 1294034 | 1/1992 |
| CA | 2109951 | 11/1992 |

(Continued)

OTHER PUBLICATIONS

Ahnood, et al.: "Effect of threshold voltage instability on field effect mobility in thin film transistors deduced from constant current measurements"; dated Aug. 2009.

(Continued)

*Primary Examiner* — Mary Ellen Bowman
(74) *Attorney, Agent, or Firm* — Nixon Peabody LLP

(57) ABSTRACT

A pixel structure comprises a substantially transparent substrate, a drive transistor formed on the substrate, an organic light emitting device formed on the opposite side of the drive transistor from the substrate, a reflective layer disposed between the light emitting device and the drive transistor and having a reflective surface facing the light emitting device. The reflective layer forms an opening offset from the drive transistor for passing light emitted by the light emitting device to the substrate. At least a portion of the reflective layer is preferably concave in shape to direct reflected light from the light emitting device back onto the light-emitting device.

12 Claims, 8 Drawing Sheets

(56) References Cited

U.S. PATENT DOCUMENTS

| | | |
|---|---|---|
| 5,204,661 A | 4/1993 | Hack et al. |
| 5,572,444 A | 11/1996 | Lentz et al. |
| 5,589,847 A | 12/1996 | Lewis |
| 5,670,973 A | 9/1997 | Bassetti et al. |
| 5,691,783 A | 11/1997 | Numao et al. |
| 5,744,824 A | 4/1998 | Kousai et al. |
| 5,745,660 A | 4/1998 | Kolpatzik et al. |
| 5,748,160 A | 5/1998 | Shieh et al. |
| 5,815,303 A | 9/1998 | Berlin |
| 5,870,071 A | 2/1999 | Kawahata |
| 5,903,248 A | 5/1999 | Irwin |
| 5,945,972 A | 8/1999 | Okumura et al. |
| 5,949,398 A | 9/1999 | Kim |
| 5,952,991 A | 9/1999 | Akiyama et al. |
| 5,982,104 A | 11/1999 | Sasaki et al. |
| 6,091,203 A | 7/2000 | Kawashima et al. |
| 6,097,360 A | 8/2000 | Holloman |
| 6,229,506 B1 | 5/2001 | Dawson et al. |
| 6,229,508 B1 | 5/2001 | Kane |
| 6,246,180 B1 | 6/2001 | Nishigaki |
| 6,259,424 B1 | 7/2001 | Kurogane |
| 6,262,589 B1 | 7/2001 | Tamukai |
| 6,288,696 B1 | 9/2001 | Holloman |
| 6,304,039 B1 | 10/2001 | Appelberg et al. |
| 6,310,962 B1 | 10/2001 | Chung et al. |
| 6,320,325 B1 | 11/2001 | Cok et al. |
| 6,373,454 B1 | 4/2002 | Knapp et al. |
| 6,414,661 B1 | 7/2002 | Shen et al. |
| 6,417,825 B1 | 7/2002 | Stewart et al. |
| 6,437,106 B1 | 8/2002 | Stoner et al. |
| 6,475,845 B2 | 11/2002 | Kimura |
| 6,501,098 B2 | 12/2002 | Yamazaki |
| 6,501,466 B1 | 12/2002 | Yamagishi et al. |
| 6,522,315 B2 | 2/2003 | Ozawa et al. |
| 6,542,138 B1 | 4/2003 | Shannon et al. |
| 6,555,420 B1 | 4/2003 | Yamazaki |
| 6,580,657 B2 | 6/2003 | Sanford et al. |
| 6,583,398 B2 | 6/2003 | Harkin |
| 6,594,606 B2 | 7/2003 | Everitt |
| 6,618,030 B2 | 9/2003 | Kane et al. |
| 6,639,244 B1 | 10/2003 | Yamazaki et al. |
| 6,668,645 B1 | 12/2003 | Gilmour et al. |
| 6,677,713 B1 | 1/2004 | Sung |
| 6,680,580 B1 | 1/2004 | Sung |
| 6,687,266 B1 | 2/2004 | Ma et al. |
| 6,690,000 B1 | 2/2004 | Muramatsu et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,724,151 B2 | 4/2004 | Yoo |
| 6,734,636 B2 | 5/2004 | Sanford et al. |
| 6,738,035 B1 | 5/2004 | Fan |
| 6,753,655 B2 | 6/2004 | Shih et al. |
| 6,753,834 B2 | 6/2004 | Mikami et al. |
| 6,756,741 B2 | 6/2004 | Li |
| 6,756,952 B1 | 6/2004 | Decaux et al. |
| 6,756,958 B2 | 6/2004 | Furuhashi et al. |
| 6,771,028 B1 | 8/2004 | Winters |
| 6,777,712 B2 | 8/2004 | Sanford et al. |
| 6,777,888 B2 | 8/2004 | Kondo |
| 6,781,567 B2 | 8/2004 | Kimura |
| 6,806,638 B2 | 10/2004 | Lih et al. |
| 6,809,706 B2 | 10/2004 | Shimoda |
| 6,828,950 B2 | 12/2004 | Koyama |
| 6,853,371 B2 | 2/2005 | Miyajima et al. |
| 6,859,193 B1 | 2/2005 | Yumoto |
| 6,873,117 B2 | 3/2005 | Ishizuka |
| 6,876,346 B2 | 4/2005 | Anzai et al. |
| 6,885,356 B2 | 4/2005 | Hashimoto |
| 6,900,485 B2 | 5/2005 | Lee |
| 6,903,734 B2 | 6/2005 | Eu |
| 6,909,419 B2 | 6/2005 | Zavracky et al. |
| 6,911,960 B1 | 6/2005 | Yokoyama |
| 6,911,964 B2 | 6/2005 | Lee et al. |
| 6,914,448 B2 | 7/2005 | Jinno |
| 6,924,602 B2 | 8/2005 | Komiya |
| 6,937,215 B2 | 8/2005 | Lo |
| 6,937,220 B2 | 8/2005 | Kitaura et al. |
| 6,943,500 B2 | 9/2005 | LeChevalier |
| 6,954,194 B2 | 10/2005 | Matsumoto et al. |
| 6,956,547 B2 | 10/2005 | Bae et al. |
| 6,975,142 B2 | 12/2005 | Azami et al. |
| 6,975,332 B2 | 12/2005 | Arnold et al. |
| 6,995,510 B2 | 2/2006 | Murakami et al. |
| 6,995,519 B2 | 2/2006 | Arnold et al. |
| 7,023,408 B2 | 4/2006 | Chen et al. |
| 7,027,015 B2 | 4/2006 | Booth, Jr. et al. |
| 7,027,078 B2 | 4/2006 | Reihl |
| 7,034,793 B2 | 4/2006 | Sekiya et al. |
| 7,038,392 B2 | 5/2006 | Libsch et al. |
| 7,057,359 B2 | 6/2006 | Hung et al. |
| 7,061,451 B2 | 6/2006 | Kimura |
| 7,064,733 B2 | 6/2006 | Cok et al. |
| 7,071,932 B2 | 7/2006 | Libsch et al. |
| 7,088,051 B1 | 8/2006 | Cok |
| 7,088,052 B2 | 8/2006 | Kimura |
| 7,102,378 B2 | 9/2006 | Kuo et al. |
| 7,106,285 B2 | 9/2006 | Naugler |
| 7,116,058 B2 | 10/2006 | Lo et al. |
| 7,119,493 B2 | 10/2006 | Fryer et al. |
| 7,122,835 B1 | 10/2006 | Ikeda et al. |
| 7,164,417 B2 | 1/2007 | Cok |
| 7,224,332 B2 | 5/2007 | Cok |
| 7,245,277 B2 | 7/2007 | Ishizuka |
| 7,274,363 B2 | 9/2007 | Ishizuka et al. |
| 7,315,295 B2 | 1/2008 | Kimura |
| 7,321,348 B2 | 1/2008 | Cok et al. |
| 7,355,574 B1 | 4/2008 | Leon et al. |
| 7,358,941 B2 | 4/2008 | Ono et al. |
| 7,368,868 B2 | 5/2008 | Sakamoto |
| 7,414,600 B2 | 8/2008 | Nathan et al. |
| 7,423,617 B2 | 9/2008 | Giraldo et al. |
| 7,502,000 B2 | 3/2009 | Yuki et al. |
| 7,528,812 B2 | 5/2009 | Tsuge et al. |
| 7,535,449 B2 | 5/2009 | Miyazawa |
| 7,554,512 B2 | 6/2009 | Steer |
| 7,569,849 B2 | 8/2009 | Nathan et al. |
| 7,576,718 B2 | 8/2009 | Miyazawa |
| 7,609,239 B2 | 10/2009 | Chang |
| 7,619,594 B2 | 11/2009 | Hu |
| 7,619,597 B2 | 11/2009 | Nathan et al. |
| 7,633,470 B2 | 12/2009 | Kane |
| 7,800,558 B2 | 9/2010 | Routley et al. |
| 7,859,492 B2 | 12/2010 | Kohno |
| 7,924,249 B2 | 4/2011 | Nathan et al. |
| 7,978,187 B2 | 7/2011 | Nathan et al. |
| 7,994,712 B2 | 8/2011 | Sung et al. |
| 8,026,876 B2 | 9/2011 | Nathan et al. |
| 8,049,420 B2 | 11/2011 | Tamura et al. |
| 8,115,707 B2 | 2/2012 | Nathan et al. |
| 8,223,177 B2 | 7/2012 | Nathan et al. |
| 8,232,939 B2 | 7/2012 | Nathan et al. |
| 8,279,143 B2 | 10/2012 | Nathan et al. |
| 2001/0009283 A1 | 7/2001 | Arao et al. |
| 2001/0040541 A1 | 11/2001 | Yoneda et al. |
| 2001/0052940 A1 | 12/2001 | Hagihara et al. |
| 2002/0012057 A1 | 1/2002 | Kimura |
| 2002/0018034 A1 | 2/2002 | Ohki et al. |
| 2002/0030190 A1 | 3/2002 | Ohtani et al. |
| 2002/0047565 A1 | 4/2002 | Nara et al. |
| 2002/0052086 A1 | 5/2002 | Maeda |
| 2002/0084463 A1 | 7/2002 | Sanford et al. |
| 2002/0101152 A1* | 8/2002 | Kimura .................. 313/505 |
| 2002/0101172 A1 | 8/2002 | Bu |
| 2002/0105279 A1 | 8/2002 | Kimura |
| 2002/0117722 A1 | 8/2002 | Osada et al. |
| 2002/0122308 A1 | 9/2002 | Ikeda |
| 2002/0158587 A1 | 10/2002 | Komiya |
| 2002/0158666 A1 | 10/2002 | Azami et al. |
| 2002/0158823 A1 | 10/2002 | Zavracky et al. |
| 2002/0169575 A1 | 11/2002 | Everitt |
| 2002/0186214 A1 | 12/2002 | Siwinski |

(56) References Cited

U.S. PATENT DOCUMENTS

| | | | |
|---|---|---|---|
| 2002/0190924 A1 | 12/2002 | Asano et al. | |
| 2002/0190971 A1 | 12/2002 | Nakamura et al. | |
| 2002/0195967 A1 | 12/2002 | Kim et al. | |
| 2003/0020413 A1 | 1/2003 | Oomura | |
| 2003/0030603 A1 | 2/2003 | Shimoda | |
| 2003/0057895 A1 | 3/2003 | Kimura | |
| 2003/0063081 A1 | 4/2003 | Kimura et al. | |
| 2003/0076048 A1 | 4/2003 | Rutherford | |
| 2003/0122745 A1 | 7/2003 | Miyazawa | |
| 2003/0142088 A1 | 7/2003 | LeChevalier | |
| 2003/0151569 A1 | 8/2003 | Lee et al. | |
| 2003/0179626 A1 | 9/2003 | Sanford et al. | |
| 2003/0230141 A1 | 12/2003 | Gilmour et al. | |
| 2003/0231148 A1 | 12/2003 | Lin et al. | |
| 2004/0032382 A1 | 2/2004 | Cok et al. | |
| 2004/0066357 A1 | 4/2004 | Kawasaki | |
| 2004/0070557 A1 | 4/2004 | Asano et al. | |
| 2004/0090400 A1 | 5/2004 | Yoo | |
| 2004/0135749 A1 | 7/2004 | Kondakov et al. | |
| 2004/0150592 A1 | 8/2004 | Mizukoshi et al. | |
| 2004/0174347 A1 | 9/2004 | Sun et al. | |
| 2004/0183759 A1 | 9/2004 | Stevenson et al. | |
| 2004/0188687 A1* | 9/2004 | Arnold et al. | 257/72 |
| 2004/0189627 A1 | 9/2004 | Shirasaki et al. | |
| 2004/0239596 A1 | 12/2004 | Ono et al. | |
| 2004/0257353 A1 | 12/2004 | Imamura et al. | |
| 2004/0257355 A1 | 12/2004 | Naugler | |
| 2004/0263444 A1 | 12/2004 | Kimura | |
| 2004/0263445 A1 | 12/2004 | Inukai et al. | |
| 2005/0007355 A1 | 1/2005 | Miura | |
| 2005/0017650 A1 | 1/2005 | Fryer et al. | |
| 2005/0024081 A1 | 2/2005 | Kuo et al. | |
| 2005/0035353 A1* | 2/2005 | Adachi et al. | 257/72 |
| 2005/0057580 A1 | 3/2005 | Yamano et al. | |
| 2005/0067970 A1 | 3/2005 | Libsch et al. | |
| 2005/0068270 A1 | 3/2005 | Awakura et al. | |
| 2005/0073264 A1 | 4/2005 | Matsumoto | |
| 2005/0083323 A1 | 4/2005 | Suzuki et al. | |
| 2005/0088103 A1 | 4/2005 | Kageyama et al. | |
| 2005/0110420 A1 | 5/2005 | Arnold et al. | |
| 2005/0140598 A1 | 6/2005 | Kim et al. | |
| 2005/0140610 A1 | 6/2005 | Smith et al. | |
| 2005/0145891 A1 | 7/2005 | Abe | |
| 2005/0156831 A1 | 7/2005 | Yamazaki et al. | |
| 2005/0168416 A1 | 8/2005 | Hashimoto et al. | |
| 2005/0179628 A1 | 8/2005 | Kimura | |
| 2005/0206590 A1 | 9/2005 | Sasaki et al. | |
| 2005/0269959 A1 | 12/2005 | Uchino et al. | |
| 2005/0269960 A1 | 12/2005 | Ono et al. | |
| 2006/0001613 A1 | 1/2006 | Routley et al. | |
| 2006/0030084 A1 | 2/2006 | Young | |
| 2006/0038758 A1 | 2/2006 | Routley et al. | |
| 2006/0077135 A1 | 4/2006 | Cok et al. | |
| 2006/0097628 A1 | 5/2006 | Suh et al. | |
| 2006/0097631 A1* | 5/2006 | Lee | 313/504 |
| 2006/0124940 A1* | 6/2006 | Miyazawa | 257/79 |
| 2006/0170623 A1 | 8/2006 | Naugler, Jr. et al. | |
| 2006/0232522 A1 | 10/2006 | Roy et al. | |
| 2006/0273997 A1 | 12/2006 | Nathan et al. | |
| 2006/0290618 A1 | 12/2006 | Goto | |
| 2007/0001937 A1 | 1/2007 | Park et al. | |
| 2007/0001939 A1 | 1/2007 | Hashimoto et al. | |
| 2007/0008268 A1 | 1/2007 | Park et al. | |
| 2007/0035225 A1* | 2/2007 | Lee et al. | 313/111 |
| 2007/0080905 A1 | 4/2007 | Takahara | |
| 2007/0080908 A1 | 4/2007 | Nathan et al. | |
| 2007/0103419 A1 | 5/2007 | Uchino et al. | |
| 2007/0182671 A1 | 8/2007 | Nathan et al. | |
| 2007/0285359 A1 | 12/2007 | Ono | |
| 2007/0296672 A1 | 12/2007 | Kim et al. | |
| 2008/0001525 A1 | 1/2008 | Chao et al. | |
| 2008/0036708 A1 | 2/2008 | Shirasaki | |
| 2008/0042942 A1 | 2/2008 | Takahashi | |
| 2008/0042948 A1 | 2/2008 | Yamashita et al. | |
| 2008/0048951 A1 | 2/2008 | Naugler, Jr. et al. | |
| 2008/0074413 A1 | 3/2008 | Ogura | |
| 2008/0116787 A1 | 5/2008 | Hsu et al. | |
| 2008/0117144 A1 | 5/2008 | Nakano et al. | |
| 2009/0174628 A1 | 7/2009 | Wang et al. | |
| 2009/0213046 A1 | 8/2009 | Nam | |
| 2011/0227964 A1 | 9/2011 | Chaji et al. | |
| 2012/0056558 A1 | 3/2012 | Toshiya et al. | |
| 2013/0057595 A1 | 3/2013 | Nathan et al. | |
| 2013/0112960 A1 | 5/2013 | Chaji et al. | |

FOREIGN PATENT DOCUMENTS

| | | |
|---|---|---|
| CA | 2368386 | 9/1999 |
| CA | 2432530 | 7/2002 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CA | 2550102 | 4/2008 |
| CN | 1760945 | 4/2006 |
| EP | 0 158 366 | 10/1985 |
| EP | 1028471 | 8/2000 |
| EP | 1 111 577 | 6/2001 |
| EP | 1 194 013 | 3/2002 |
| EP | 1 335 430 A1 | 8/2003 |
| EP | 1 381 019 | 1/2004 |
| EP | 1 521 203 A2 | 4/2005 |
| EP | 1 594 347 | 11/2005 |
| JP | 4-042619 | 2/1992 |
| JP | 6-314977 | 11/1994 |
| JP | 8-340243 | 12/1996 |
| JP | 10-254410 | 9/1998 |
| JP | 11-202295 | 7/1999 |
| JP | 2001-134217 | 5/2001 |
| JP | 2001-195014 | 7/2001 |
| JP | 2002-278513 | 9/2002 |
| JP | 2003-076331 | 3/2003 |
| JP | 2003-177709 | 6/2003 |
| JP | 2003-308046 | 10/2003 |
| JP | 2004-145197 | 5/2004 |
| JP | 4158570 | 10/2008 |
| KR | 2004-0100887 | 12/2004 |
| TW | 342486 | 10/1998 |
| TW | 473622 | 1/2002 |
| TW | 1221268 | 9/2004 |
| TW | 1223092 | 11/2004 |
| WO | 98/48403 | 10/1998 |
| WO | 9948079 | 9/1999 |
| WO | 01/27910 A1 | 4/2001 |
| WO | 03/034389 | 4/2003 |
| WO | 03/063124 | 7/2003 |
| WO | 2004/003877 | 1/2004 |
| WO | 2004/034364 | 4/2004 |
| WO | 2004/047058 | 6/2004 |
| WO | 2005/022498 | 3/2005 |
| WO | 2005/029456 | 3/2005 |
| WO | 2005/055186 | 6/2005 |
| WO | 2006/063448 | 6/2006 |
| WO | 2009/055920 | 5/2009 |
| WO | 2011/067729 | 6/2011 |

OTHER PUBLICATIONS

Alexander, et al.: "Pixel circuits and drive schemes for glass and elastic AMOLED displays"; dated Jul. 2005 (9 pages).

Ashtiani, et al.: "AMOLED Pixel Circuit With Electronic Compensation of Luminance Degradation"; dated Mar. 2007 (4 pages).

Chahi, et al.: "An Enhanced and Simplified Optical Feedback Pixel Circuit for AMOLED Displays"; dated Oct. 2006.

Chaji, et al.: "A Current-Mode Comparator for Digital Calibration of Amorphous Silicon AMOLED Displays"; dated Jul. 2008 (5 pages).

Chaji, et al.: "A Low-Cost Stable Amorphous Silicon AMOLED Display with Full V~T- and V~O~L~E~D Shift Compensation"; dated May 2007 (4 pages).

Chaji, et al.: "A low-power driving scheme for a-Si:H active-matrix organic light-emitting diode displays"; dated Jun. 2005 (4 pages).

(56) References Cited

OTHER PUBLICATIONS

Chaji, et al.: "A low-power high-performance digital circuit for deep submicron technologies"; dated Jun. 2005 (4 pages).
Chaji, et al.: "A novel a-Si:H AMOLED pixel circuit based on short-term stress stability of a-Si:H TFTs"; dated Oct. 2005 (3 pages).
Chaji, et al.: "A Novel Driving Scheme and Pixel Circuit for AMOLED Displays"; dated Jun. 2006 (4 pages).
Chaji, et al.: "A novel driving scheme for high-resolution large-area a-Si:H AMOLED displays"; dated Aug. 2005 (4 pages).
Chaji, et al.: "A Stable Voltage-Programmed Pixel Circuit for a-Si:H AMOLED Displays"; dated Dec. 2006 (12 pages).
Chaji, et al.: "A Sub-μA fast-settling current-programmed pixel circuit for AMOLED displays"; dated Sep. 2007.
Chaji, et al.: "Compensation technique for DC and transient instability of thin film transistor circuits for large-area devices"; dated Aug. 2008.
Chaji, et al.: "Driving scheme for stable operation of 2-TFT a-Si AMOLED pixel"; dated Apr. 2005 (2 pages).
Chaji, et al.: "Dynamic-effect compensating technique for stable a-Si:H AMOLED displays"; dated Aug. 2005 (4 pages).
Chaji, et al.: "Electrical Compensation of OLED Luminance Degradation"; dated Dec. 2007 (3 pages).
Chaji, et al.: "eUTDSP: a design study of a new VLIW-based DSP architecture"; dated May 2003 (4 pages).
Chaji, et al.: "Fast and Offset-Leakage Insensitive Current-Mode Line Driver for Active Matrix Displays and Sensors"; dated Feb. 2009 (8 pages).
Chaji, et al.: "High Speed Low Power Adder Design With a New Logic Style: Pseudo Dynamic Logic (SDL)"; dated Oct. 2001 (4 pages).
Chaji, et al.: "High-precision, fast current source for large-area current-programmed a-Si flat panels"; dated Sep. 2006 (4 pages).
Chaji, et al.: "Low-Cost AMOLED Television with IGNIS Compensating Technology"; dated May 2008 (4 pages).
Chaji, et al.: "Low-Cost Stable a-Si:H AMOLED Display for Portable Applications"; dated Jun. 2006 (4 pages).
Chaji, et al.: "Low-Power Low-Cost Voltage-Programmed a-Si:H AMOLED Display"; dated Jun. 2008 (5 pages).
Chaji, et al.: "Merged phototransistor pixel with enhanced near infrared response and flicker noise reduction for biomolecular imaging"; dated Nov. 2008.
Chaji, et al.: "Parallel Addressing Scheme for Voltage-Programmed Active-Matrix OLED Displays"; dated May 2007 (6 pages).
Chaji, et al.: "Pseudo dynamic logic (SDL): a high-speed and low-power dynamic logic family"; dated 2002 (4 pages).
Chaji, et al.: "Stable a-Si:H circuits based on short-term stress stability of amorphous silicon thin film transistors"; dated May 2006 (4 pages).
Chaji, et al.: "Stable Pixel Circuit for Small-Area High-Resolution a-Si:H AMOLED Displays"; dated Oct. 2008 6 pages).
Chaji, et al.: "Thin-Film Transistor Integration for Biomedical Imaging and AMOLED Displays"; dated May 2008 (177 pages).
Eric R. Fossum. "Active Pixel Sensors: Are CCD's Dinosaurs?" SPIE: Symposium on Electronic Imaging. Feb. 1, 1993 (13 pages).
European Search Report for European Application No. EP 011 12 2313 dated Sep. 14, 2005 (4 pages).
European Search Report for European Application No. EP 05 81 9617 dated Jan. 30, 2009.
European Search Report for European Application No. EP 07 81 5784 dated Jul. 20, 2010 (2 pages).
European Search Report for European Application No. EP 07710608.6 dated Mar. 19, 2010 (7 pages).
European Supplementary Search Report corresponding to European Application No. EP 04786662 dated Jan. 19, 2007 (2 pages).
European Supplementary Search Report for European Application No. EP 05 75 9141 dated Oct. 30, 2009 (2 pages).
Extended European Search Report mailed Feb. 12, 2009 issued in European Patent Application No. 05819617.1 (9 pages).
Extended European Search Report mailed Nov. 29, 2012, issued in European Patent Application No. 11168677.0 (13 page).
Goh, et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
International Preliminary Report on Patentability for International Application No. PCT/CA2005/001007 dated Oct. 16, 2006 (4 pages).
International Search Report corresponding to International Application No. PCT/CA2004/001742, Canadian Patent Office, dated Feb. 21, 2005 (2 pages).
International Search Report corresponding to International Application No. PCT/IB2010/055541 filed Dec. 1, 2010, dated May 26, 2011; 5 pages.
International Search Report for International Application No. PCT/CA2005/001007 dated Oct. 18, 2005 (2 pages).
International Search Report mailed Dec. 3, 2002, issued in International Patent Application No. PCT/JP02/09668 (4 pages).
International Search Report mailed Mar. 21, 2006 issued in International Patent Application No. PCT/CA2005/001897 (2 pages).
International Search Report, PCT/IB2012/052372, mailed Sep. 12, 2012 (3 pages).
International Searching Authority Search Report, PCT/IB2011/051103, dated Jul. 8, 2011, 3 pages.
International Searching Authority Written Opinion, PCT/IB2011/051103, dated Jul. 8, 2011, 6 pages.
Jafarabadiashtiani, et al.: "A New Driving Method for a-Si AMOLED Displays Based on Voltage Feedback"; dated May 2005 (4 pages).
Kanicki, J., et al. "Amorphous Silicon Thin-Film Transistors Based Active-Matrix Organic Light-Emitting Displays." Asia Display: International Display Workshops, Sep. 2001 (pp. 315-318).
Karim, K. S., et al. "Amorphous Silicon Active Pixel Sensor Readout Circuit for Digital Imaging." IEEE: Transactions on Electron Devices. vol. 50, No. 1, Jan. 2003 (pp. 200-208).
Lee, et al.: "Ambipolar Thin-Film Transistors Fabricated by PECVD Nanocrystalline Silicon"; dated May 2006 (6 pages).
Matsueda y, et al.: "35.1: 2.5-in. AMOLED with Integrated 6-bit Gamma Compensated Digital Data Driver"; dated May 2004.
Mendes E., et al. "A High Resolution Switch-Current Memory Base Cell." IEEE: Circuits and Systems. vol. 2, Aug. 1999 (pp. 718-721).
Nathan, et al., "Amorphous Silicon Thin Film Transistor Circuit Integration for Oganic LED Displays on Glass and Plastic", IEEE Journal of Solid-State Circuits, vol. 39, No. 9, Sep. 2004, 12 pages.
Nathan, et al.: "Backplane Requirements for Active Matrix Organic Light Emitting Diode Displays"; dated Aug. 2006 (16 pages).
Nathan, et al.: "Call for papers second international workshop on compact thin-film transistor (TFT) modeling for circuit simulation"; dated Sep. 2009 (1 page).
Nathan, et al.: "Driving schemes for a-Si and LTPS AMOLED displays"; dated Dec. 2005 (11 pages).
Nathan, et al.: "Invited Paper: a -Si for AMOLED—Meeting the Performance and Cost Demands of Display Applications (Cell Phone to HDTV)"; dated Jun. 2006 (4 pages).
Philipp: "Charge transfer sensing" Sensor Review, vol. 19, No. 2, Dec. 31, 1999, 10 pages.
Rafati, et al.: "Comparison of a 17 b multiplier in Dual-rail domino and in Dual-rail D L (D L) logic styles"; dated 2002 (4 pages).
Safavian, et al.: "3-TFT active pixel sensor with correlated double sampling readout circuit for real-time medical x-ray imaging"; dated Jun. 2006 (4 pages).
Safavian, et al.: "A novel current scaling active pixel sensor with correlated double sampling readout circuit for real time medical x-ray imaging"; dated May 2007 (7 pages).
Safavian, et al.: "A novel hybrid active-passive pixel with correlated double sampling CMOS readout circuit for medical x-ray imaging"; dated May 2008 (4 pages).
Safavian, et al.: "Self-compensated a-Si:H detector with current-mode readout circuit for digital X-ray fluoroscopy"; dated Aug. 2005 (4 pages).
Safavian, et al.: "TFT active image sensor with current-mode readout circuit for digital x-ray fluoroscopy [5969D-82]"; dated Sep. 2005 (9 pages).
Safavian, et al.: "Three-TFT image sensor for real-time digital X-ray imaging"; dated Feb. 2, 2006 (2 pages).

(56) References Cited

OTHER PUBLICATIONS

Vygranenko, et al.: "Stability of indium-oxide thin-film transistors by reactive ion beam assisted deposition"; dated Oct. 1, 2009.
Wang, et al.: "Indium oxides by reactive ion beam assisted evaporation: From material study to device application"; dated Mar. 2009 (6 pages).

Yi He, et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
International Search Report and Written Opinion mailed Mar. 5, 2014 which issued in corresponding International Patent Application No. PCT/IB2013/061228 (8 pages).

* cited by examiner

HIGH RESOLUTION PIXEL ARCHITECTURE

CROSS-REFERENCE TO RELATED APPLICATION(S)

This application claims priority to, and is a continuation-in-part of, U.S. application Ser. No. 12/958,035, filed Dec. 1, 2010, which is herein incorporated by reference in its entirety. This application further claims priority to Canadian Application No. 2,686,174, which was filed Dec. 1, 2009, herein incorporated by reference in its entirety.

FIELD OF THE INVENTION

The present invention generally relates to active matrix organic light emitting device (AMOLED) displays, and particularly to a pixel structure that has a larger aperture ratio in such displays.

BACKGROUND

Currently, active matrix organic light emitting device ("AMOLED") displays are being introduced. The advantages of such displays include lower power consumption, manufacturing flexibility and faster refresh rate over conventional liquid crystal displays. In contrast to conventional liquid crystal displays, there is no backlighting in an AMOLED display as each pixel consists of different colored organic light emitting devices (e.g., red, green and blue) emitting light independently. The organic light emitting diodes (OLED) emit light based on current supplied through a drive transistor. The drive transistor is typically a thin film transistor (TFT) fabricated from either amorphous silicon or polysilicon. The power consumed in each OLED has a direct relation with the magnitude of the generated light in that OLED.

The drive-in current of the drive transistor determines the pixel's luminance and the surface (aperture) of the actual OLED device determines the pixel's OLED lifetime. AMOLED displays are typically fabricated from the OLED, the drive transistor, any other supporting circuits such as enable or select transistors as well as various other drive and programming lines. Such other components reduce the aperture of the pixel because they do not emit light but are needed for proper operation of the OLED.

Generally color displays have three OLEDs arranged in a "stripe" for each pixel 10 as shown in FIG. 1A. The pixel 10 in FIG. 1A is a bottom emission type OLED where the OLEDs are fabricated on the substrate of the integrated circuit where there is no other components such as transistors and metal lines. The pixel 10 includes OLEDs 12, 14 and 16 and corresponding drive transistors 22, 24 and 26 arranged in parallel creating a "stripe" arrangement. Parallel power lines 32, 34 and 36 are necessary to provide voltage to the OLEDs 12, 14 and 16 and drive transistors 22, 24 and 26. The OLEDs 12, 14 and 16 emit red, green and blue light respectively and different luminance levels for each OLED 12, 14 and 16 may be programmed to produce colors along the spectrum via programming voltages input from a series of parallel data lines 42, 44 and 46. As shown in FIG. 1A, additional area must be reserved for a select line 50 and the data lines 42, 44 and 46 as well as the power lines 32, 34 and 36 for the OLEDs 12, 14 and 16 and the drive transistors 22, 24 and 26. In this known configuration, the aperture of the integrated circuit of the pixel 10 is much less than the overall area of the integrated circuit because of the areas needed for the drive transistor and power and data lines. For example, in producing a shadow mask for fabricating such an integrated circuit for the pixel 10, the distance between two adjacent OLEDs such as the OLEDs 12 and 14 and the OLED size is significant (larger than 20 um). As a result, for high resolution display (e.g. 253 ppi with 33.5 um sub pixel width), the aperture ratio will be very low.

FIG. 1B shows a circuit diagram of the electronic components, namely the OLED 12, the drive transistor 22, the power input for the drive voltage line 32 and the programming voltage input 42 for each of the color OLEDs that make up the pixel 10. The programming voltage input 42 supplies variable voltage to the drive transistor 22 that in turn regulates the current to the OLED 12 to determine the luminance of the OLED 12.

FIG. 1C shows the cross section for the conventional bottom emission structure such as for the pixel 10 in FIG. 1A. As is shown, OLED 12 is fabricated to the side of the other components on the substrate in an open area. Thus, the OLED light emission area is limited by the other components in the pixel. A common electrode layer 70 provides electrical connection to the OLED 12. In this case, the current density is high because of the limited area for light emission. The OLED voltage is also high due to higher current density. As a result, the power consumption is higher and the OLED lifetime is reduced.

Another type of integrated circuit configuration for each of the OLEDs that make up the pixel involves fabricating the OLED over the backplane components (such as transistors and metal traces) and is termed a top emission configuration. The top emission configuration allows greater surface area for the OLED and hence a higher aperture ratio, but requires a thinner common electrode to the OLEDs because such an electrode must be transparent to allow light to be emitted from the OLEDs. The thin electrode results in higher resistance and causes significant voltage drop across this electrode. This may be an issue for larger area displays which in nature need a larger area common electrode.

Therefore, currently, the apertures of pixels for OLED displays are limited due to the necessity of drive transistors and other circuitry. Further, the aperture ratios of the OLEDs in OLED displays are also limited because of the necessity to have a minimal amount of space between OLEDs due to design rule requirements. Therefore, there is a need for increasing the aperture ratios of OLED based integrated circuit pixels for higher resolution displays.

SUMMARY

In accordance with one embodiment, a pixel structure comprises a substantially transparent substrate, a drive transistor formed on the substrate, an organic light emitting device formed on the opposite side of the drive transistor from the substrate, a reflective layer disposed between the light emitting device and the drive transistor and having a reflective surface facing the light emitting device, the reflective layer forming an opening offset from the drive transistor for passing light emitted by the light emitting device to the substrate. At least a portion of the reflective layer is preferably concave in shape to direct reflected light from the light emitting device back onto the light-emitting device.

In one implementation, the pixel structure comprises a substrate; a first photoresist layer having a first opening over the substrate; a reflective layer having a second opening, the reflective layer covering the first photoresist layer; a second photoresist layer in the second opening and over the reflective layer; and an organic light emitting device formed over the second photoresist layer, The second opening overlaps with the first opening, and at least a portion of the reflective layer is concave in shape. A drive transistor is disposed between the substrate and the first photoresist layer for controlling the luminance of the organic light emitting device. The organic light emitting device preferably comprises an anode layer over the second photoresist layer, an organic electroluminescent layer over the anode layer, and a cathode layer over the organic electroluminescent layer. The reflective layer has a reflective surface facing the organic light emitting device, and directing light from the organic light emitting device to the second opening.

In accordance with another embodiment, a method of forming a pixel structure comprises providing a substrate; forming a first photoresist layer having a first opening over the substrate; forming a reflective layer having a second opening, the reflective layer covering the first photoresist layer; forming a second photoresist layer in the second opening and over the reflective layer; and forming an organic light emitting device over the second photoresist layer. The second opening overlaps the first opening, and at least a portion of the reflective layer is concave in shape. In one implementation, the step of forming the first photoresist layer comprises depositing the first photoresist layer on the substrate; forming a first mask layer on the first photoresist layer; depositing a third photoresist layer on the first mask layer; forming a second mask layer on the third photoresist layer; applying ultraviolet radiation to the second mask layer, thereby separating the third photoresist layer; removing the second mask layer; etching the first mask layer with the third photoresist layer, thereby separating the first mask layer; removing the third photoresist layer; etching the first photoresist layer with the first mask layer, thereby forming the first opening; and removing the first mask layer.

The step of forming the reflective layer preferably comprises depositing the reflective layer on the first photoresist layer and the substrate; depositing a third photoresist layer on the reflective layer; applying ultraviolet radiation to the third photoresist layer; developing the third photoresist layer; etching the reflective layer with the third photoresist layer, thereby forming the second opening; and removing the third photoresist layer.

The step of forming an organic light emitting device over the second photoresist layer preferably comprises forming an anode layer over the second photoresist layer; forming an organic electroluminescent layer over the anode layer; and forming a cathode layer over the organic electroluminescent layer.

The step of forming an organic electroluminescent layer over the anode layer preferably comprises forming a hole injection layer over the anode layer; forming a hole transport layer over the hole injection layer; forming an emission layer over the hole transport layer; forming an electron transport layer over the emission layer; and forming an electron injection layer over the electron transport layer.

Another example is an integrated circuit for a pixel. The integrated circuit includes a common electrode layer and an organic light emitting device located on the common electrode layer. The organic light emitting device includes an emission surface. A drive transistor is disposed on part of the emission surface. A reflector layer is disposed between the drive transistor and the organic light emitting device. The reflector layer includes an aperture over the emission surface and a reflective surface facing the emission surface. The reflective surface reflects light emitted from the light emitting surface through the aperture.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1A:
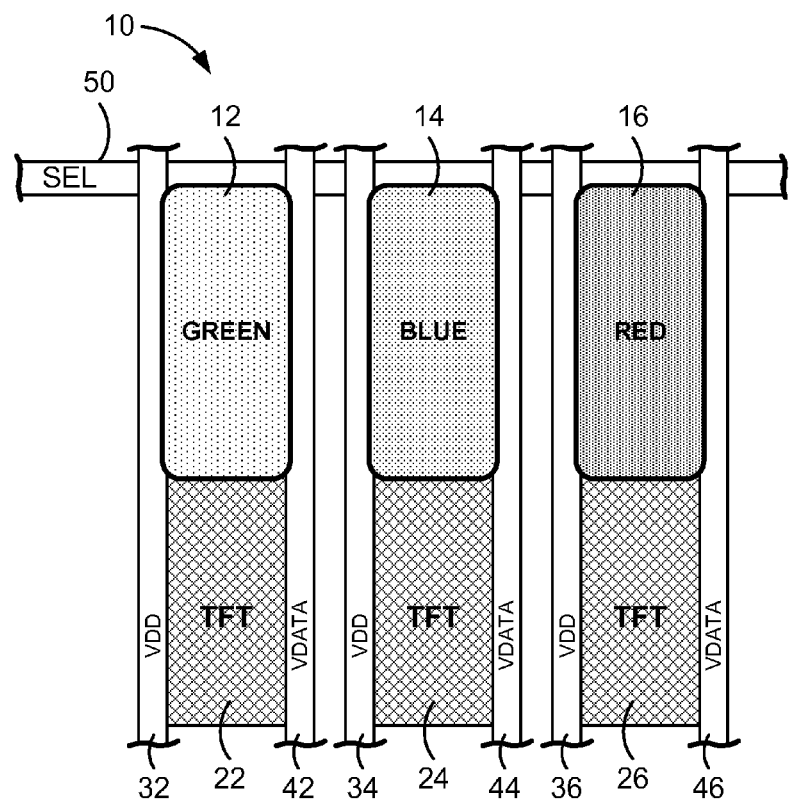
FIG. 1A is a layout of a prior art integrated circuit for an OLED pixel.
Figure 1C:
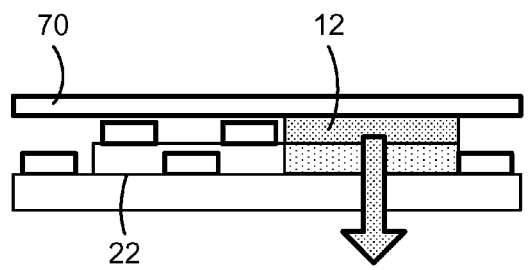
FIG. 1C is a side view of the integrated circuit of the OLED pixel in FIG. 1A.
Figure 1B:
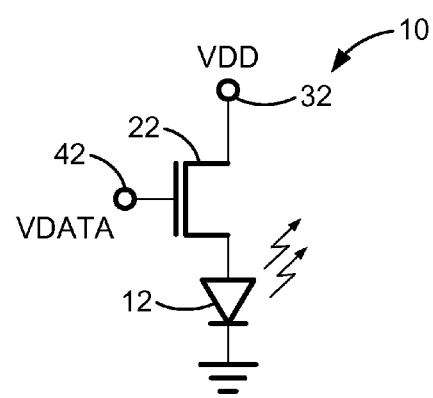
FIG. 1B is a circuit diagram of one of the OLEDs and corresponding drive transistor for the OLED pixel in FIG. 1A.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Figure 2:
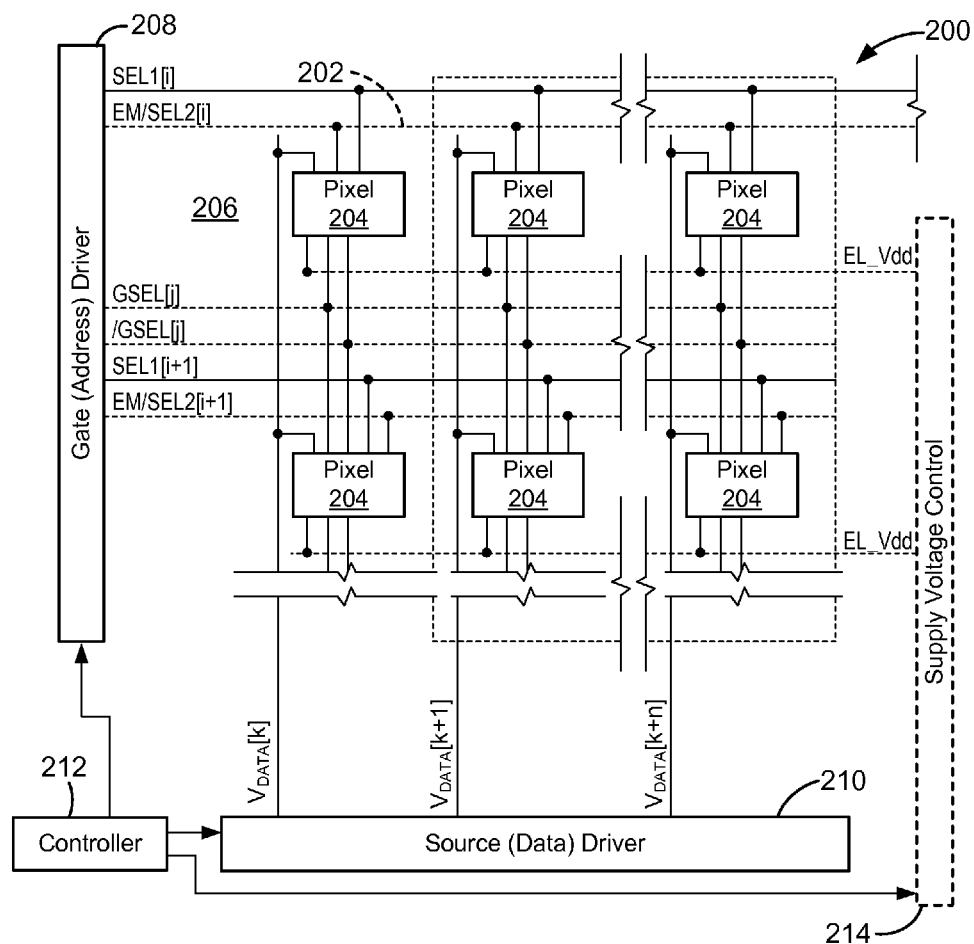
FIG. 2 is a block diagram of an AMOLED display with reference pixels to correct data for parameter compensation control.

FIG. 2 is an electronic display system 200 having an active matrix area or pixel array 202 in which an array of active pixels 204a-d are arranged in a row and column configuration. Each of the active pixels 204 includes red, green and blue organic light emitting devices (OLED) to emit different color components that are combined to produce different colors for emission from the pixel. For ease of illustration, only two rows and columns of pixels are shown. External to the active matrix area 202 is a peripheral area 206 where peripheral circuitry for driving and controlling the pixel array 202 are located. The peripheral circuitry includes a gate or address driver circuit 208, a source or data driver circuit 210, a controller 212, and an optional supply voltage (e.g., Vdd) driver 214. The controller 212 controls the gate, source, and supply voltage drivers 208, 210, 214. The gate driver circuit 208, under control of the controller 212, operates on address or select lines SEL[i], SEL[i+1], and so forth, one for each row of pixels 204 in the pixel array 202. In pixel sharing configurations described below, the gate or address driver circuit 208 can also optionally operate on global select lines GSEL[j] and optionally/GSEL[j], which operate on multiple rows of pixels 204*a-d* in the pixel array 202, such as every two rows of pixels 204. The source driver circuit 210, under control of the controller 212, operates on voltage data lines Vdata[k], Vdata[k+1], and so forth, one for each column of pixels 204 in the pixel array 202. The voltage data lines carry voltage programming information to each pixel 204 indicative of brightness of each of the color components of the light emitting devices in the pixel 204. A storage element, such as a capacitor, in each of the light emitting devices of the pixels 204 stores the voltage programming information until an emission or driving cycle turns on each of the light emitting devices. The optional supply voltage driver 214, under control of the controller 212, controls a supply voltage (VDD) line, one for each row of pixels 204 in the pixel array 202.

The display system 200 may also include a current source circuit, which supplies a fixed current on current bias lines. In some configurations, a reference current can be supplied to the current source circuit. In such configurations, a current source control controls the timing of the application of a bias current on the current bias lines. In configurations in which the reference current is not supplied to the current source circuit, a current source address driver controls the timing of the application of a bias current on the current bias lines.

As is known, each pixel 204 in the display system 200 needs to be programmed with data indicating the brightness of each of the light emitting devices in the pixel 204 to produce the desired color to be emitted from the pixel 204. A frame defines the time period that includes a programming cycle or phase during which each and every pixel 204 in the display system 200 is programmed with programming voltages indicative of a brightness and a driving or emission cycle or phase during which each light emitting device in each pixel is turned on to emit light at a brightness commensurate with the programming voltage stored in a storage element. A frame is thus one of many still images that compose a complete moving picture displayed on the display system 200. There are at least two schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 200 are programmed first, and all of the pixels are driven row-by-row. Either scheme can employ a brief vertical blanking time at the beginning or end of each frame during which the pixels are neither programmed nor driven.

The components located outside of the pixel array 202 may be located in a peripheral area 206 around the pixel array 202 on the same physical substrate on which the pixel array 202 is disposed. These components include the gate driver 208, the source driver 210 and the optional supply voltage control 214. Alternately, some of the components in the peripheral area can be disposed on the same substrate as the pixel array 202 while other components are disposed on a different substrate, or all of the components in the peripheral area can be disposed on a substrate different from the substrate on which the pixel array 202 is disposed. Together, the gate driver 208, the source driver 210, and the supply voltage control 214 make up a display driver circuit. The display driver circuit in some configurations may include the gate driver 208 and the source driver 210 but not the supply voltage control 214.

The display system 200 further includes a current supply and readout circuit 220, which reads output data from data output lines, VD [k], VD [k+1], and so forth, one for each column of pixels 204*a*, 204*c* in the pixel array 202. The drive transistors for the OLEDs in the pixels 204 in this example are thin film transistors that are fabricated from amorphous silicon. Alternatively, the drive transistors may be fabricated from polysilicon.

In the configurations for the OLEDs described below, the aperture ratio is improved through minimizing the blocked area of the OLED emission surface by changing the arrangement of the drive transistors and the OLEDs. Another configuration for top emission allows the light guided from the area that is blocked by the drive transistor and metallic layers such as power and programming lines to a window over the emission surface of the OLED. As a result, the aperture ratio is much larger than actual opening.

The arrangement of OLED and drive transistors described below makes the pixel opening less dependent to the fabrication design rules that require certain distances between OLEDs and certain widths of voltage supply and data lines. This technique allows fabrication of high resolution displays while results in reasonable aperture ratio without the need for a high resolution fabrication process. Consequently, the use of shadow masks becomes possible, or even easier, for partitioning the pixel for high pixel densities.

Figure 3:
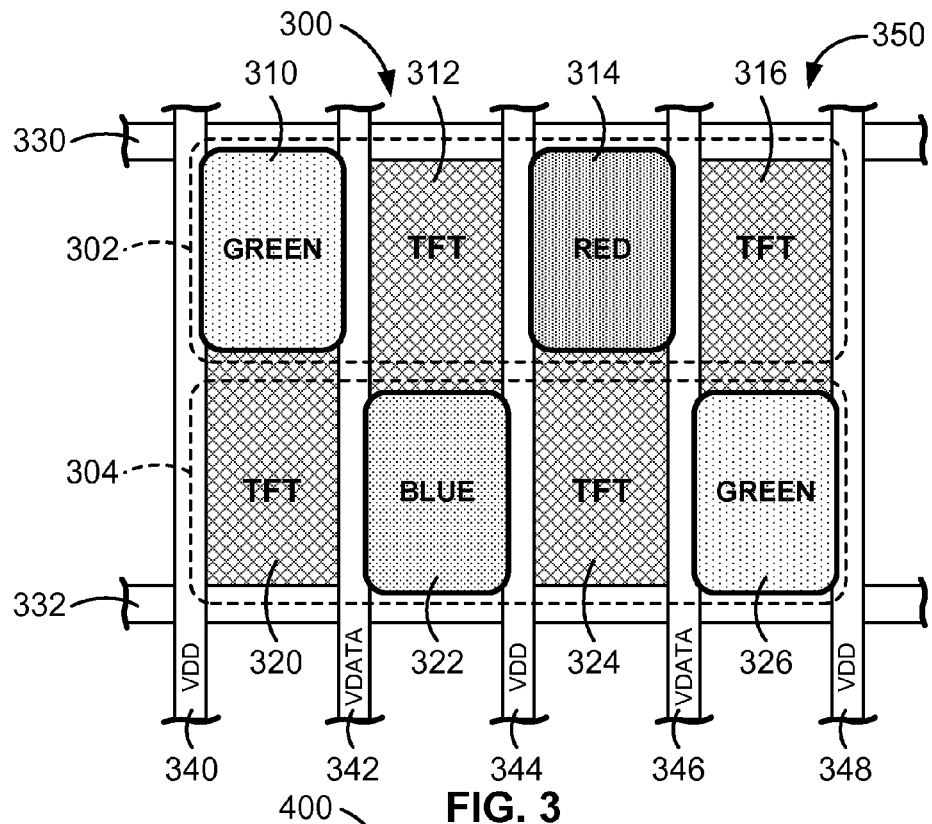
FIG. 3 is a configuration of an integrated circuit for a RGB type pixel having staggered OLEDs for increased aperture.

FIG. 3 shows a top view of an integrated circuit layout for a pixel 300 which is a staggered architecture for a RGB bottom emission pixel. The integrated circuit layout of the pixel 300 includes a top subrow 302 and a bottom subrow 304 each having a series of OLEDs. Each of the OLEDs constitute a sub-pixel in the individual pixels such as the pixel 300. The sub-pixels (e.g. green, red and blue) alternate between the subrows. In this example, the top subrow 302 includes a green OLED 310, a drive transistor 312, a red OLED 314 and a drive transistor 316. The bottom subrow 304 includes a drive transistor 320, a blue OLED 322, a drive transistor 324 and a green OLED 326. A select line 330 is fabricated on top of the top subrow 302 and a select line 332 is fabricated on the bottom of the bottom subrow 304. The drive transistor 316 and the green OLED 326 belong to a next pixel 350 in the array and share the select lines 330 and 332 with the pixel 300. The OLEDs 310, 314 and 322 in the pixel 300 are therefore in staggered arrangement allowing them to be placed closer together side by side. It is to be understood that the term subrow is simply used for convenience. From another perspective, the different OLEDs may be staggered on adjacent columns. The various OLEDs are arranged so certain OLEDs are next to each other and other OLEDs are above or below the OLEDs next to each other in order to allow the increase in the width of the OLEDs.

A power line 340 borders both the green OLED 310 and the drive transistor 320. A data line 342 is fabricated between the green OLED 310 and the drive transistor 312 of the top subrow 302 and continues between the drive transistor 320 and the blue OLED 322 of the bottom subrow 304. A power line 344 is fabricated between the drive transistor 312 and the red OLED 314 of the top subrow 302 and continues between the blue OLED 322 and the drive transistor 324 of the bottom subrow 304. The structure of the pixel 300 also includes a data line 346 fabricated between the red OLED 314 and the drive transistor 314 of the top subrow 302 and continues between the transistor 324 and the green OLED 326 of the bottom subrow 304. Another power line 348 borders the drive transistor 316 of the top subrow 302 and the green OLED 326 of the bottom subrow 304. The drive transistor 316 and the green OLED 326 are part of the next pixel 350 adjacent to the pixel 300 but share the data line 346.

In FIG. 3, the display circuit of the pixel 300 is divided into the two subrows 302 and 304. The OLEDs 310, 322 and 314 are put on top and bottom side of the pixel area alternatively.

As a result, the distance between two adjacent OLEDs will be larger than the minimum required distance. Also, the data lines such as the data lines 342 and 346 may be shared between two adjacent pixels such as the pixel 300 and the adjacent pixel 350. This results in a large aperture ratio because the distance between the OLEDs such as the OLED 310 and the OLED 322 may be reduced due to the staggered configuration resulting in larger emission areas of the OLEDs. Since the OLEDs in the pixel 300 share power lines, the surface area necessary for such lines is reduced allowing the area to be open to the emission surfaces of the OLEDs therefore further increasing the aperture ratio.

Figure 4:
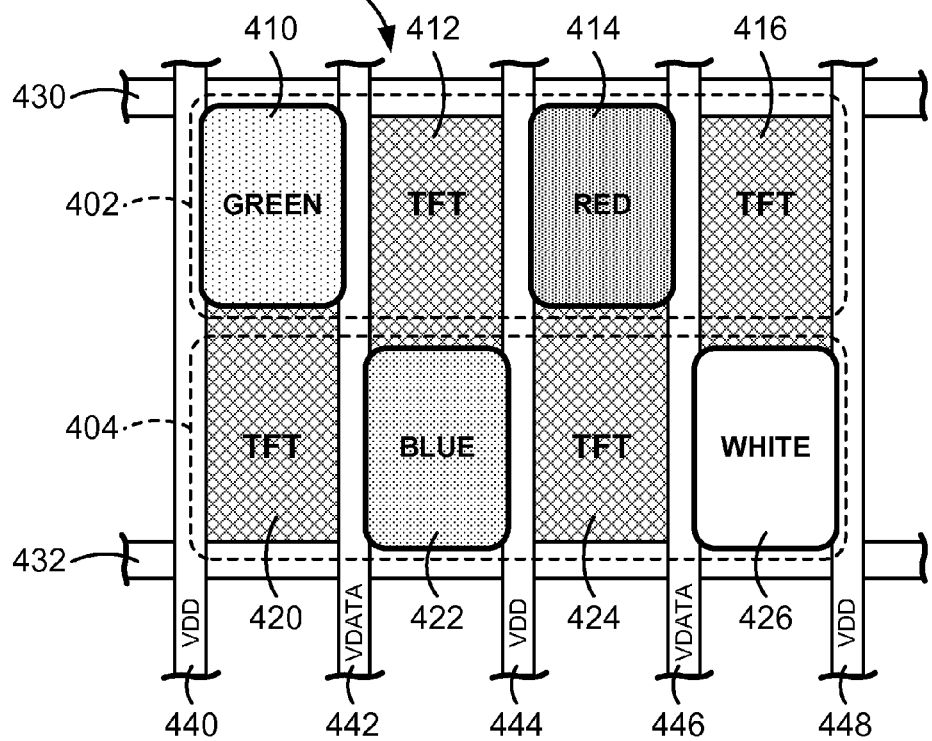
FIG. 4 is a configuration of an integrated circuit for a RGBW type pixel having staggered OLEDs for increased aperture.

FIG. 4 shows an example staggered architecture for a RGBW bottom emission display pixel circuit 400. The integrated circuit layout for the pixel 400 includes a top subrow 402 and a bottom subrow 404. In this example, the top subrow 402 includes a green OLED 410, a drive transistor 412, a red OLED 414 and a drive transistor 416. The bottom subrow 404 includes a drive transistor 420, a blue OLED 422, a drive transistor 424 and a white OLED 426. FIG. 4 shows the entire pixel which includes the four OLEDs 410, 414, 422 and 426.

A select line 430 is fabricated on top of the top subrow 402 and a select line 432 is fabricated on the bottom of the bottom subrow 404. A power line 440 borders both the green OLED 410 and the drive transistor 420. A data line 442 is fabricated between the green OLED 410 and the drive transistor 412 of the top subrow 402 and continues between the drive transistor 420 and the blue OLED 422 of the bottom subrow 404. A power line 444 is fabricated between the drive transistor 412 and the red OLED 414 of the top subrow 402 and continues between the blue OLED 422 and the drive transistor 424 of the bottom subrow 404. The circuit 400 also includes a data line 446 fabricated between the red OLED 414 and the drive transistor 416 of the top subrow 402 and continues between the drive transistor 424 and the white OLED 426 of the bottom subrow 404. Another power line 448 borders the drive transistor 416 of the top subrow 402 and the white OLED 426 of the bottom subrow 404. The power lines 440 and 448 are shared by adjacent pixels (not shown).

As with the configuration in FIG. 3, the pixel circuit 400 in FIG. 4 has increased aperture because the distance between parallel OLEDs may be decreased due to the staggered relationship between the OLEDs 410, 414, 422 and 426. The white OLED 426 is added since most of the display using the pixel circuit 400 typically emits white color and the white OLED 426 reduces continuous emissions from the blue OLED 422 which is primarily employed to emit white color in RGB type pixels such as the pixel 300 in FIG. 3. As with the configuration in FIG. 3, the distances between the OLEDs may be decreased resulting in greater exposure of the emission surface areas. Further, the sharing of the data and power supply lines also reduces the area necessary for such lines resulting in additional surface emission area being exposed for the OLEDs.

Figure 5:
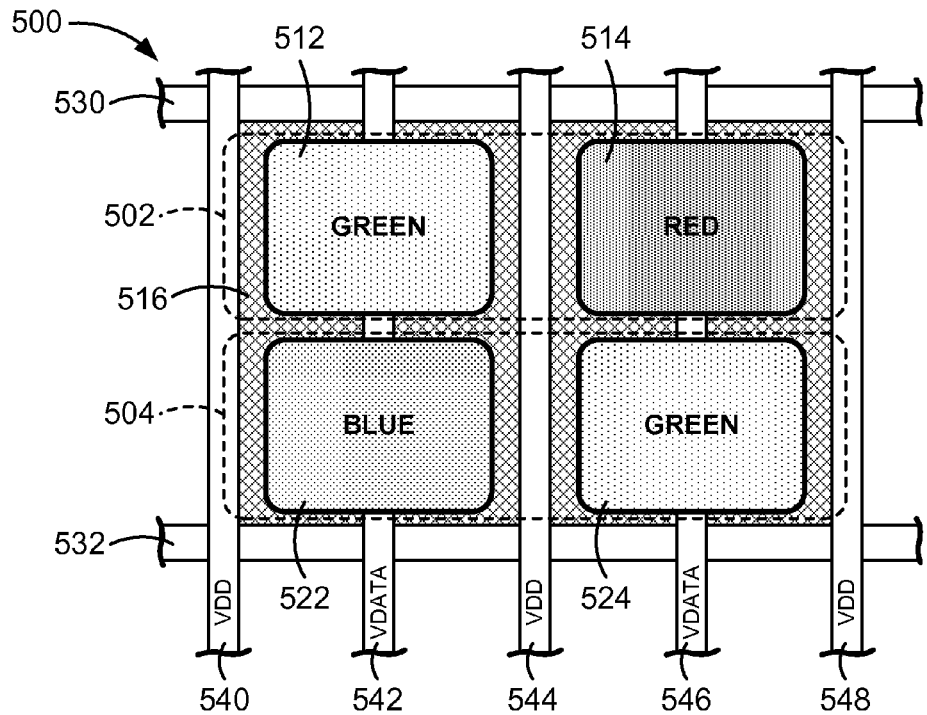
FIG. 5 is a configuration of an integrated circuit for a top emission arrangement for an RGB OLED pixel.

The same staggered arrangement as shown in FIGS. 3 and 4 may be used for the top emission type OLED integrated circuit. FIG. 5 shows a staggered color patterning for a RGB top-emission display structure 500. The structure 500 includes a top subrow 502 and a bottom subrow 504. The top subrow 502 includes a green OLED 512 and a red OLED 514. The drive transistors to drive the OLEDs 512 and 514 are mounted on a lower circuit layer 516 under the OLEDs 512 and 514. The bottom subrow 504 includes a blue OLED 522 and a green OLED 524. Drive transistors that drive the OLEDs 522 and 524 are fabricated on a circuit layer 526 under the OLEDs 522 and 524. In the display structure 500, the OLEDs 512, 514 and 522 make up one pixel, while the green OLED 524 is part of another pixel. Thus the structure 500 results in a display with interlocked pixels which share various data lines. Such pixels require some interpolation of image data since the data lines are shared between the OLEDs of the pixels.

A select line 530 is fabricated on top of the top subrow 502 and a select line 532 is fabricated on the bottom of the bottom subrow 504. A power line 540 borders both the green OLED 510 and the blue OLED 520. A data line 542 is fabricated under the green OLED 510 and of the top subrow 502 and continues under the blue OLED 522 of the bottom subrow 504. The data line 542 is used to program the green OLED 512 and the blue OLED 522. A power line 544 is fabricated between the green OLED 512 and the red OLED 514 of the top subrow 502 and continues between the blue OLED 522 and the green OLED 524 of the bottom subrow 504. A data line 546 fabricated over the red OLED 514 of the top subrow 502 and continues over the green OLED 524 of the bottom subrow 504. The data line 546 is used to program the red OLED 514 and the green OLED 524. Another power line 548 borders the red OLED 514 of the top subrow 502 and the green OLED 524 of the bottom subrow 504. The power lines 540 and 548 are shared by the transistors and OLEDs of adjacent pixels.

In this case, sharing the data programming lines 542 and 546 (VDATA) in the top emission structure 500 leads to more area for the drive transistors under the OLEDs. As a result, the drive transistors in the emission structure 500 may have larger source, drain and gate regions and the aging of the drive transistors will be slower because of lower current densities required by the transistors.

The emission structure 500 allows reduction of distance between the OLEDs 512 and 522 because of the staggered arrangement. The OLEDs 512, 514, 522 and 524 may be made wider than a known OLED, but with a relatively shorter length. The wider OLED surface results in increased aperture ratio. The emission structure 500 requires a processed image data signal from a raw RGB signal because the OLEDs are staggered with OLEDs from the adjacent pixels. The transparent common electrode (not shown) over the OLEDs 512, 514, 522 and 524 has relatively lower resistance because of the wider areas of the OLEDs 512, 514, 522 and 524.

Figure 6:
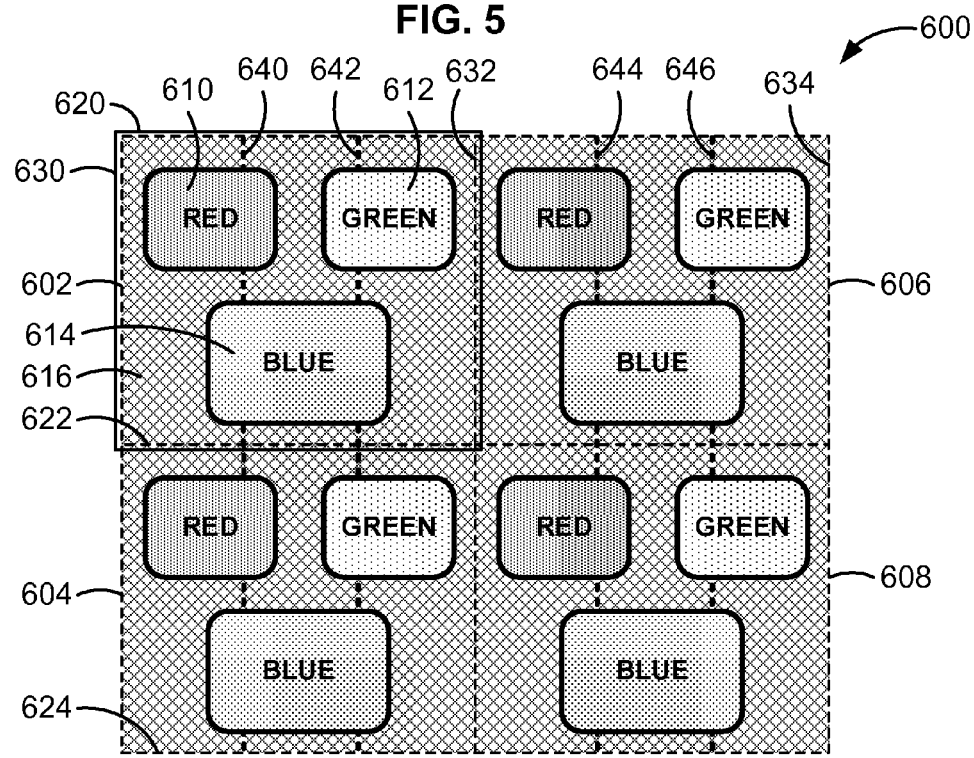
FIG. 6 is an alternate configuration for an integrated circuit for a top emission RGB OLED pixel.

FIG. 6 shows an alternate pixel arrangement 600 for a top emission structure. The pixel arrangement 600 improves the aperture ratio and relaxes OLED manufacturing requirements. The pixel arrangement 600 includes different pixels 602, 604, 606 and 608. Each of the pixels has three OLEDs such as OLEDs 610, 612 and 614 which are disposed on a circuit layer 616 that includes the drive transistors to drive each of the OLEDs 610, 612 and 614. In this case, the OLED 610 emits green light and is in a row with the OLED 612 that emits red light. The OLED 614 emits a blue light and has a larger emission surface than the OLEDs 610 and 612. Select lines such as select lines 620, 622 and 624 run on the top and the bottom of the pixels 602, 604, 606 and 608. Power supply lines 630, 632 and 634 run along the sides of the pixels 602, 604, 606 and 608 to supply voltages for the OLEDs 610, 612 and 614 and their respective drive transistors. Data lines 640, 642, 644 and 646 run under the OLEDs of the pixels 602, 604, 606 and 608. For example, the data line 640 is used to program the OLED 610, the data line 642 is used to program the OLED 612 and either data line 640 or 644 is used to program the OLED 614 in the pixel 602.

In the structure 600, any single current is within one sub-row. As a result, the lines look straighter in a display composed of pixels using the arrangement 600 and so provide better quality for text application. The OLED 614 that emits blue light is larger than the OLEDs 610 and 612, covering substantially the entire width of the pixel 602, because the increased surface area for the blue color OLED 614 retards aging which is the result of inherent faster aging for a blue color OLED. The increased surface area requires lower current density to produce the same output as a smaller surface OLED and therefore ages slower. The structure 600 in FIG. 6 has an improved appearance over the structure 500 in FIG. 5 because the red, green and blue OLED elements are in a straight line as opposed to being staggered between pixels. As with the structure 500 in FIG. 5, the transparent common electrode (not shown) over the OLEDs 610, 612 and 614 has relatively lower resistance because of the wider areas of the OLEDs 610, 612 and 614, as shown in FIG. 9E.

Figure 7:
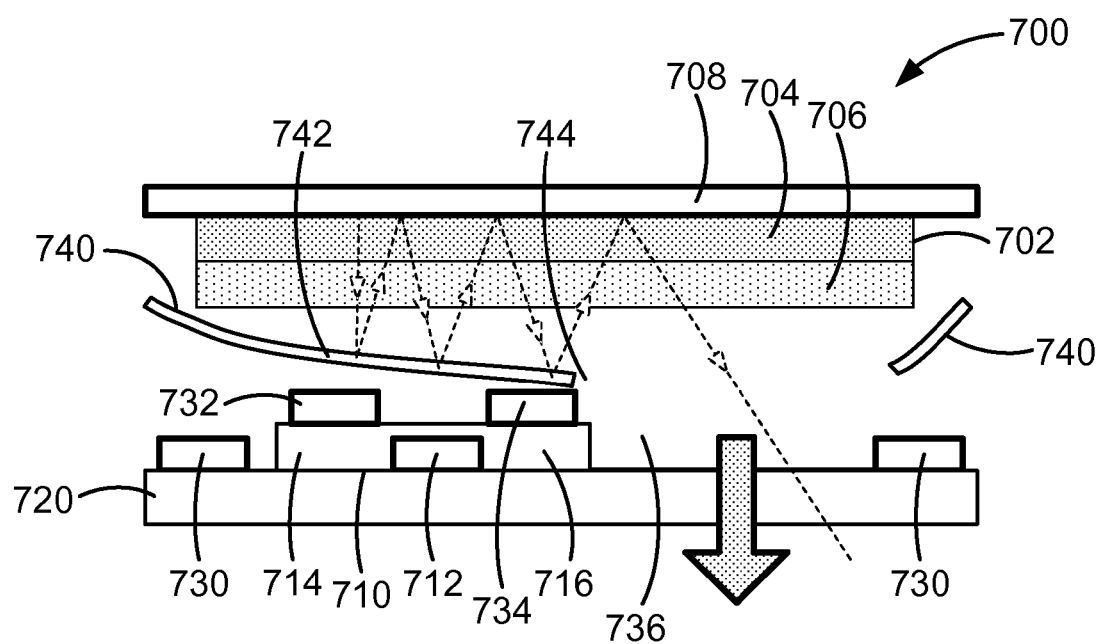
FIG. 7 is a cross section view of an OLED pixel with a reflector to increase luminance output from the pixel.

FIG. 7 shows the cross section of a pixel structure 700 that is a modified bottom emission type pixel that increases aperture ratio by having a reflector focus light emitted from the areas of the emission area of an OLED 702 that are covered by other circuit components. The OLED 702 includes a cathode layer 704 and an anode layer 706. A common electrode layer 708 provides electrical bias to the other side of the OLED 702. The common electrode 708 can be shaped as a concave mirror to reflect more light toward the reflective surface 740. A drive transistor 710 is fabricated over part of the emission surface of the OLED 702. The drive transistor 710 includes a gate 712, a drain region 714 and a source region 716. The drive transistor 710 is fabricated on a clear substrate layer 720 that overlays the OLED 702. A metallization layer 730 is overlaid on the clear substrate 720 to form electrodes 732 and 734 contacting the drain region 714 and the source region 716 of the drive transistor 710 respectively and provide electrical connections to the other components of the circuit such as data and voltage supply lines. An electrode (not shown) is also formed to the gate of the transistor 710. The metallization layer 730 includes an aperture 736 through which light from the OLED 702 may be emitted through the clear substrate 720.

The pixel structure includes a reflector 740 that is disposed between the OLED 702 and the drive transistor 710. The reflector 740 includes a reflective surface 742 facing the emission surface of the OLED 702 that reflects light emitted from the OLED 702 that would be normally blocked by the drive transistor 710. The reflected light (shown in arrows in FIG. 7) is emitted out a window 744 in the reflector 740 to therefore increase the light actually emitted from the OLED 702.

Thus the OLED emission area is not limited to the opening window which is defined by the drive transistor and supporting components on the OLED 702. As a result, the OLED current density for a given luminance is lower than a conventional bottom emission arrangement. This arrangement including the reflector 740 requires lower OLED voltage and therefore lower power consumption to achieve the same luminance as a conventional OLED without the reflector. Moreover, the lifetime of the OLED 702 will be longer due to lower current density. This structure 700 may also be used with other techniques to further improve aperture ratio.

Figure 8A:
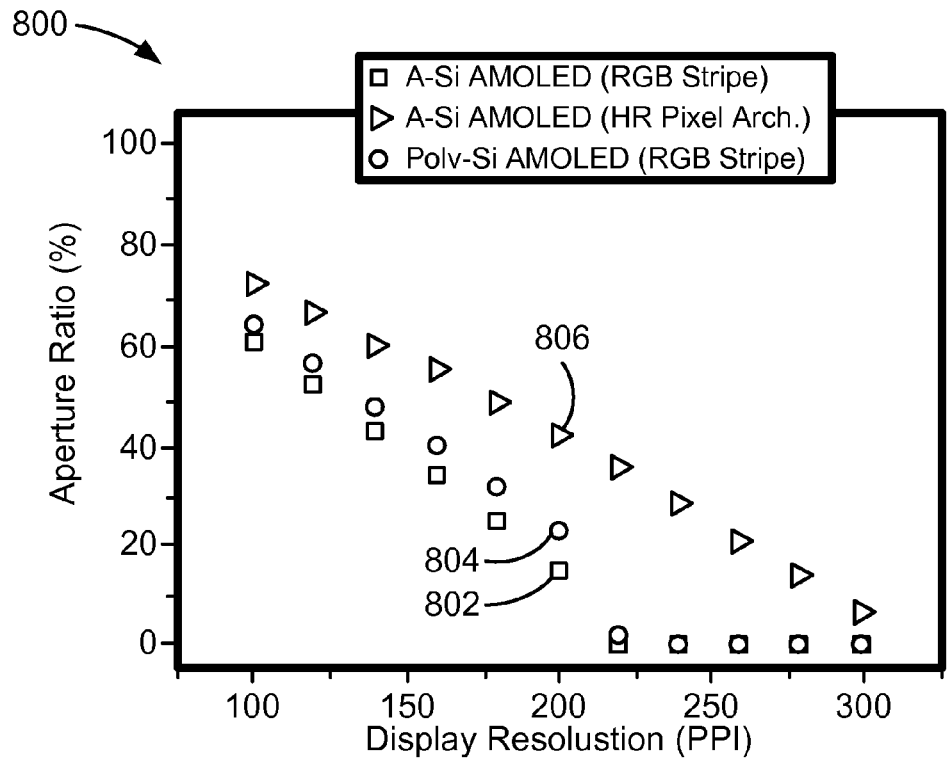
FIG. 8A is a graph of the aperture ratios of a known stripe arrangement of OLEDs in a pixel in comparison with the staggered arrangement in FIG. 3.

The aperture ratio for different display resolutions is demonstrated in a graph 800 in FIG. 8A. The graph 800 compares the aperture ratios of various configurations to display resolutions. One set of data points 802 shows the aperture ratios of a standard amorphous silicon red green blue pixel stripe structure as shown in FIG. 1A. A second set of data points 804 shows the aperture ratios of a standard polysilicon red green blue pixel stripe structure. As shown in FIG. 8A, the polysilicon based pixel has slightly better aperture ratios than the amorphous silicon based pixel. A third set of data points 806 shows the aperture ratios of a bottom emission staggered structure such as the structure of the pixel 300 shown in FIG. 3. As shown in the data points 802 in FIG. 8A, while the aperture ratio for higher resolution (e.g., 250 PPI) using a standard RGB stripe configuration is zero, the aperture ratio of the staggered pixel architecture in FIG. 3 in data points 806 is higher than 20% for up to 260 PPI.

Figure 8B:
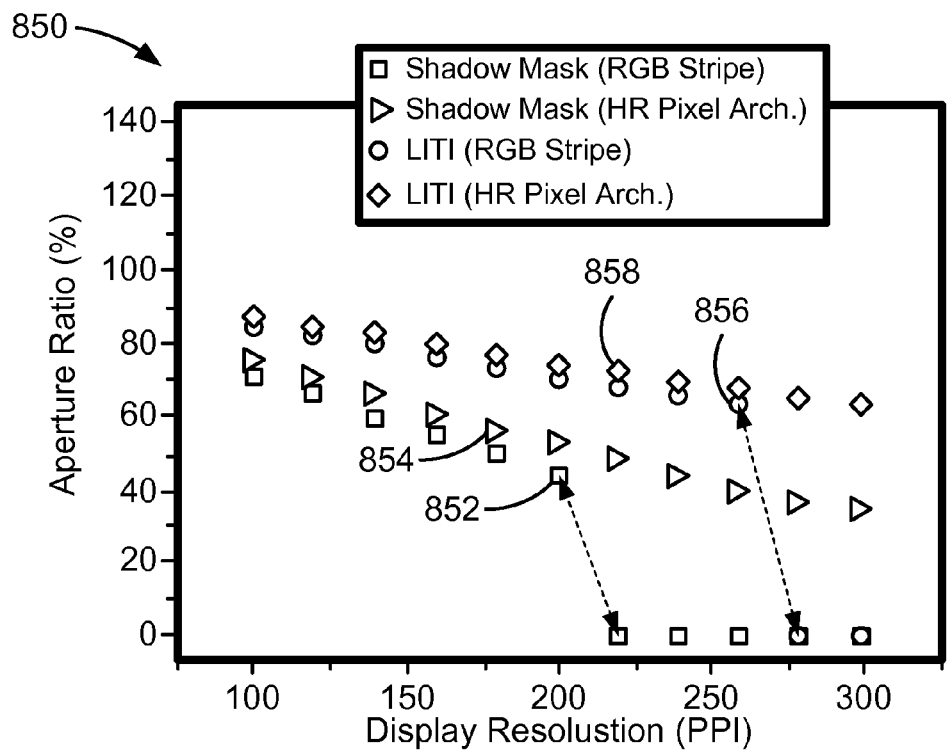
FIG. 8B is a graph of the aperture ratio of known stripe arrangements of OLEDs in a pixel in comparison with a staggered top emission arrangement such as that in FIG. 7.

FIG. 8B is a graph 850 showing the plots of aperture ratios at different display resolutions for various OLED pixel structures. One set of data points 852 shows the aperture ratios of a standard amorphous silicon red green blue pixel stripe structure as shown in FIG. 1A fabricated with a shadow mask. A second set of data points 854 shows the aperture ratios of an amorphous silicon bottom emission staggered structure such as the structure of the pixel 300 shown in FIG. 3 fabricated with a shadow mask. Another set of data points 856 shows the aperture ratios of a top emission type structure in a red green blue pixel strip structure fabricated by laser induced thermal imaging (LITI). A final set of data points 858 shows the aperture ratios of a top emission type structure using the staggered arrangement shown in FIG. 7 fabricated by LITI.

The aperture ratio is extracted for two types of OLED patterning (shadow mask with a 20-μm gap and LITI with a 10-μm gap) as shown in the data points 852 and 856 for a stripe type arrangement as shown in FIG. 1A. In the case of shadow mask fabrication, the aperture ratio for RGB stripe is limited by OLED design rules whereas a RGB stripe using LITI fabrication is limited by the TFT design rules. However, for both shadow mask and LITI fabrication, staggered color patterning can provide high resolution (e.g. 300 ppi) with large aperture ratio as shown by the data points 854 and 858. This resolution is provided without mandating tighter design rules as compared with conventional OLED layouts.

A preferred method of fabricating the pixel structure described above by (1) forming a first photoresist layer with the first opening 736 on the substrate 720, forming the reflective layer 740 with the second opening 744 over the first photoresist layer, forming a second photoresist layer in the opening 744 and over the reflective layer; and forming the organic light emitting device 702 over the second photoresist layer. The second opening 744 overlaps the first opening 736, and at least a portion of the reflective layer 740 is concave in shape. The transistor elements 710, 712, 714, 716, 732 and 734 are formed on the surface of the substrate 720 below the reflective layer, offset from the openings 736 and 744.

FIGS. 9A-9M are cross-sectional views illustrating successive steps of one exemplary fabrication process for a pixel structure having a high effective aperture ratio according to an embodiment of the invention. These steps can be used to manufacture a pixel structure as shown. The pixel structure is a modified bottom emission type pixel that increases effective aperture ratio, such that the effective aperture ratio is larger than the actual aperture ratio of the device. For simplicity of description, the transistor circuits supporting the pixel structure are omitted. However, it is contemplated that the pixel structure of FIGS. 9A-9M can include one or more supporting transistors (e.g., TFTs), such as drive transistor 710 and its associated components, positioned as shown in FIG. 7.

A substrate 910 is provided. Substrate 910 may be, for example, a glass wafer. Substrate 910 is cleaned with an RCA solution; specifically, a 1:1:5 solution of $NH_4OH$ (ammonium hydroxide), $H_2O_2$ (hydrogen peroxide), and $H_2O$ (water), respectively. Substrate 910 is cleaned with the solution at 80° C. for 20 minutes.

Figure 9A:
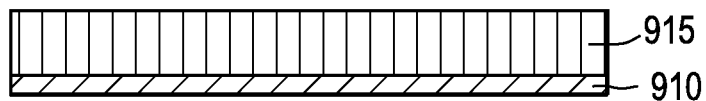
FIGS. 9A-9M are cross-sectional views illustrating the formation of a pixel structure having a high effective aperture ratio according to an embodiment of the invention.

A first photoresist layer 915 is formed to a thickness of 11.6 μm on substrate 910, as shown in FIG. 9A. In this embodiment, first photoresist layer 915 is spin coated on substrate 910 at 800 rpm for 10 seconds, then at 4000 rpm for 60 seconds. First photoresist layer 915 may comprise any suitable transparent photoresist material, such as, for example, SU-8 photoresist. In another embodiment, first photoresist layer 915 comprises a black or dark polymer. First photoresist layer 915 is then soft baked at 95° C. for 3 minutes, exposed for 16 seconds, and hard baked at 95° C. for 4 minutes.

Figure 9B:
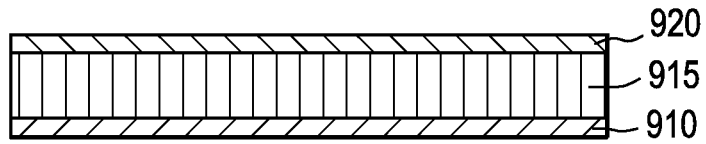

Next, as shown in FIG. 9B, a mask layer 920 is formed to a thickness of 100 nm on first photoresist layer 915. Mask layer 920 is used as a hard mask for later etching of first photoresist layer 915 and can be, for example, an aluminum film. In this embodiment, mask layer 920 is deposited using WLOS sputtering with 50 sccm Ar, 9 mTorr pressure, 300 W DC power, and 700 seconds deposition time.

Figure 9C:
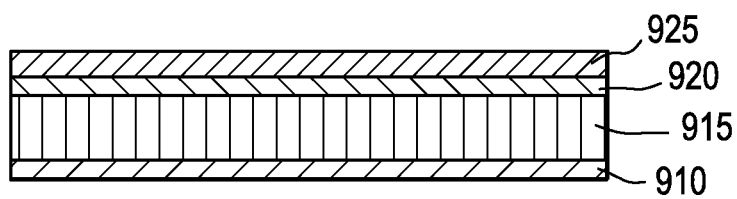

A second photoresist layer 925 is formed on mask layer 920 for photolithography, as shown in FIG. 9C. In this embodiment, second photoresist layer 925 is spin coated on mask layer 920 at 500 rpm for 10 seconds, then at 4000 rpm for 60 seconds. Second photoresist layer 925 may comprise any suitable photoresist material such as, for example, AZ3312 photoresist. Second photoresist layer 925 is then soft baked at 90° C. for 1 minute.

Figure 9D:
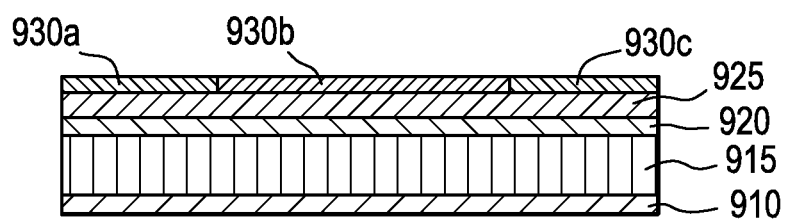
Figure 9E:
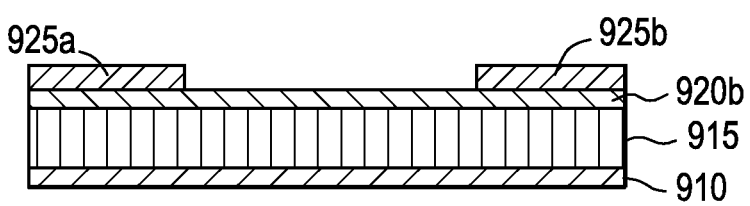

Photo mask 930a-c is then applied to second photoresist layer 925, and ultraviolent (UV) exposure is applied from the top (i.e., on the side of photo mask 930a-c), as shown in FIG. 9D. In this embodiment, UV exposure is maintained for 4 seconds with an intensity of 10 mW/cm$^2$. AZ 300 MIF developer is then applied and developed for 16 seconds, and the sample is post-exposure baked at 120° C. for 60 seconds, resulting in separate second photoresist layers 925a and 925b.

Figure 9F:
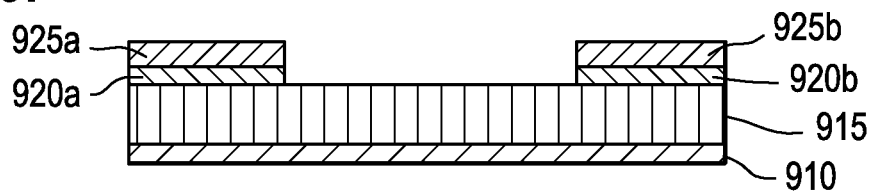

As shown in FIG. 9F, mask layer 920 is etched into separate mask layers 920a and 920b. In this embodiment, mask layer 920 is etched using a polyacrylonitrile (PAN) solution; specifically, a 16:2:1:1 solution of $H_3PO_4$ (phosphoric acid), $H_2O$ (deionized water), HAc (acetic acid), and $HNO_3$ (nitric acid), respectively, is used. Mask layer 920 is etched at 40° C. for 3-4 minutes. Then, second photoresist layers 925a and 925b are removed. In this embodiment, second photoresist layers 925a and 925b are removed using acetone or AZ300 stripper.

Figure 9G:
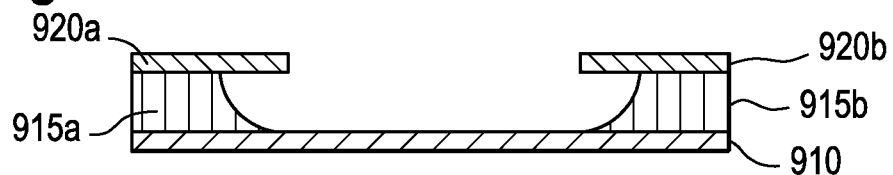
Figure 9H:
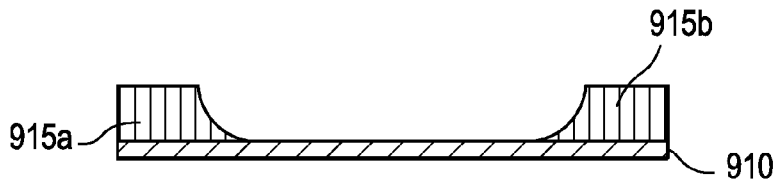

First photoresist layer 915 is then etched into separate first photoresist layers 915a, 915b, as shown in FIG. 9G, forming a concave shape. In this embodiment, first photoresist layer is isotropically dry etched using inductively coupled plasma (ICP). The ICP dry etching recipe is: 20 $O_2$, 2 $CF_4$, 180 ICP power, 50 pressure, and 700 seconds etching time. As shown in FIG. 9H, separate mask layers 920a and 920b are removed. In this embodiment, separate mask layers 920a and 920b are removed using a polyacrylonitrile (PAN) solution.

Figure 9I:
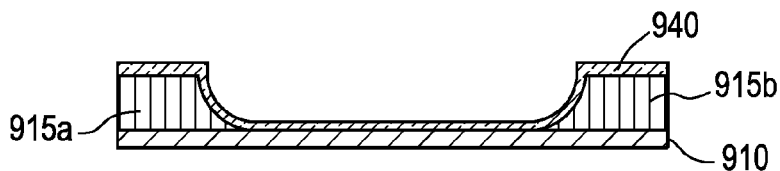
Figure 9J:
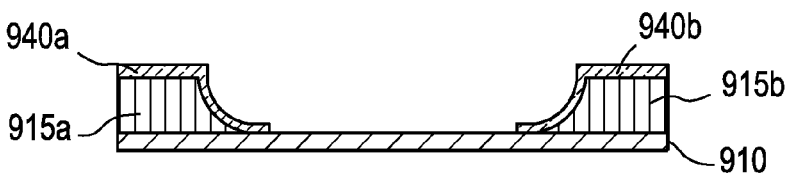

Reflective layer 940 is then deposited, as shown in FIG. 9I. In this embodiment, reflective layer 940 is deposited using WLOS sputtering with 50 sccm Ar, 9 mTorr pressure, 300 W DC power, and 700 seconds deposition time. As shown in FIG. 9J, the emission windows are then opened using photopithography. A third photoresist layer (not shown) is spin coated at 3000 rpm for 30 seconds, soft baked at 100° C. for 6 minutes, then re-hydrated for 30 minutes. The third photoresist layer can comprise any suitable photoresist layer, and in this embodiment, comprises AZ P4330 photoresist. The third photoresist layer is then exposed to 365 nm ultraviolet radiation for 35 seconds, and developed in a 1:4 solution of AZ400K developer and deionized water, respectively, for 6 minutes. The portion of mirror layer 940 on substrate 910 is then etched with polyacrylonitrile for 4 minutes, resulting in separate mirror layers 940a and 940b, and the rest of the third photoresist later is removed using stripper.

Figure 9K:
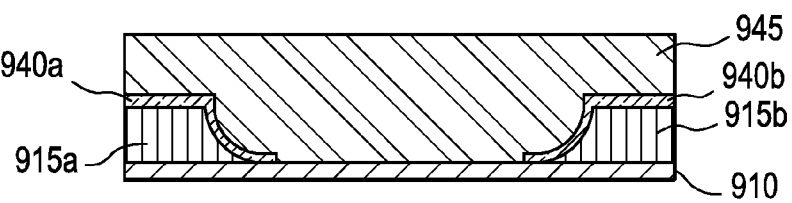

As shown in FIG. 9K, a fourth photoresist layer 945 is deposited in the opening of mirror layers 940a and 940b, and over reflective layers 940a and 940b. In this embodiment, fourth photoresist layer 945 is spin coated at 800 rpm for 10 seconds, then at 4000 rpm for 60 seconds. Fourth photoresist layer 945 may comprise any suitable transparent photoresist material, such as, for example, SU-8 photoresist. Fourth photoresist layer 945 is then soft baked at 95° C. for 3 minutes, exposed for 16 seconds, and hard baked at 95° C. for 4 minutes.

Figure 9L:
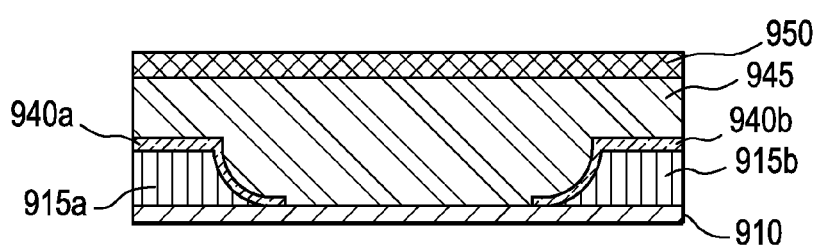

Anode 950 is then deposited over fourth photoresist layer 945, as shown in FIG. 9L. In this embodiment, anode 950 is an indium tin oxide (ITO) film. Anode 950 is deposited using an AJA sputtering system with a ratio of $Ar:O_2$ of 16:0.5, a temperature of 150° C., RF power of 100 W, and deposition time of 50 minutes. Post-annealing is then conducted at 150° C. for 30 minutes. Anode 950 can then be patterned using another photolithography process.

Figure 9M:
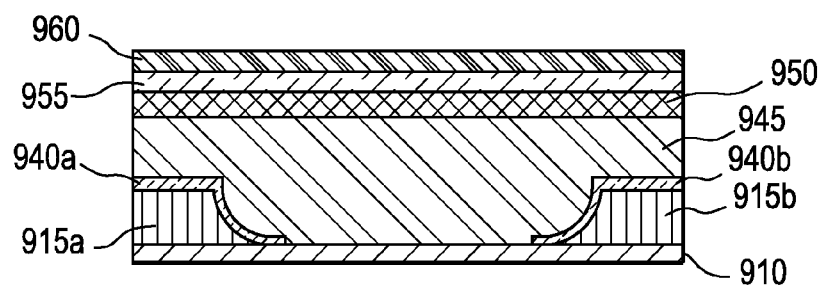

OLEDs are then deposited on top of the patterned anode 950, as shown in FIG. 9M. In this embodiment, the OLEDs are deposited using an InteVoc thermal evaporation system at a pressure under $5 \times 10^{-6}$ Torr. The OLEDs comprise anode 950, organic electroluminescent layer 955, and cathode 960. A common electrode layer (not shown) can be formed over cathode 960.

As appreciated by one skilled in the art, organic electroluminescent layer 955 can comprise a plurality of layers, including (from anode 950 to cathode 960) a hole injection layer, a hole transport layer, an emission layer, an electron transport layer and an electron injection layer. In one embodiment, the hole injection layer comprises $MoO_3$; the hole transport layer comprises NPB; the electron transport layer comprises $Alq_3$; the electron injection layer comprises LiF; and cathode 960 comprises Al.

The pixel structure includes reflective layers 940a, 940b that are disposed between the OLED (comprising anode 950, organic electroluminescent layer 955, and cathode 960) and the drive transistor(s) (not shown, but positioned between the substrate and first photoresist layers 915a and 915b). Reflective layers 940a, 940b include a reflective surface facing the emission surface of the OLED that reflects light emitted from the OLED that would be normally blocked by the drive transistor(s). The reflected light is emitted out an opening between mirror layers 940a and 940b to therefore increase the light actually emitted from the OLED. Because of the concave shape of reflective layers 940a and 940b, reflected light (as well as ambient light) is guided toward the opening between reflective layers 940a and 940b.

Thus, the OLED emission area is not limited to the opening window which is defined by the drive transistor and supporting components on the OLED. As a result, the OLED current density for a given luminance is lower than a conventional bottom emission arrangement. This arrangement including reflective layers 940a, 940b requires lower OLED voltage and therefore lower power consumption to achieve the same luminance as a convention OLED without the mirror layers. Moreover, the lifetime of the OLED will be longer due to lower current density. This structure may also be used with other techniques to further improve effective aperture ratio.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A pixel structure comprising a substantially transparent substrate, a drive transistor formed on said substrate, an organic light emitting device formed on the opposite side of said drive transistor from said substrate, a reflective layer disposed between said light emitting device and said drive transistor and having a reflective surface facing said light emitting device, said reflective layer forming an opening offset from said drive transistor for passing light emitted by said light emitting device to said substrate, and at least a portion of the reflective layer is concave in shape to direct reflected light from said light emitting device back onto said light-emitting device.

2. A pixel structure comprising
a substrate;
a first photoresist layer having a first opening over the substrate;
a reflective layer having a second opening, the reflective layer covering the first photoresist layer;
a second photoresist layer in the second opening and over the reflective layer; and
an organic light emitting device formed over the second photoresist layer,
wherein the second opening overlaps with the first opening, and at least a portion of the reflective layer is concave in shape.

3. The pixel structure of claim 2, further comprising
a drive transistor between the substrate and the first photoresist layer,
wherein the drive transistor controls the luminance of the organic light emitting device.

4. The pixel structure of claim 2, wherein the reflective layer comprises aluminum.

5. The pixel structure of claim 2, wherein the organic light emitting device comprises
an anode layer over the second photoresist layer;
an organic electroluminescent layer over the anode layer; and
a cathode layer over the organic electroluminescent layer.

6. The pixel structure of claim 5, further comprising a common electrode layer over the cathode layer.

7. The pixel structure of claim 2, wherein the reflective layer has a reflective surface facing the organic light emitting device, and directing light from the organic light emitting device to the second opening.

8. A method of forming a pixel structure, the method comprising
providing a substrate;
forming a first photoresist layer having a first opening over the substrate;
forming a reflective layer having a second opening, the reflective layer covering the first photoresist layer;
forming a second photoresist layer in the second opening and over the reflective layer; and
forming an organic light emitting device over the second photoresist layer,
wherein the second opening overlaps with the first opening, and
wherein at least a portion of the reflective layer is concave in shape.

9. The method of claim 8, wherein the step of forming the first photoresist layer comprises
depositing the first photoresist layer on the substrate;
forming a first mask layer on the first photoresist layer;
depositing a third photoresist layer on the first mask layer;
forming a second mask layer on the third photoresist layer;
applying ultraviolet radiation to the second mask layer, thereby separating the third photoresist layer;
removing the second mask layer;
etching the first mask layer with the third photoresist layer, thereby separating the first mask layer;
removing the third photoresist layer;
etching the first photoresist layer with the first mask layer, thereby forming the first opening; and
removing the first mask layer.

10. The method of claim 8, wherein the step of forming the reflective layer comprises:
depositing the reflective layer on the first photoresist layer and the substrate;
depositing a third photoresist layer on the reflective layer;
applying ultraviolet radiation to the third photoresist layer;
developing the third photoresist layer;
etching the reflective layer with the third photoresist layer, thereby forming the second opening; and
removing the third photoresist layer.

11. The method of claim 8, further comprising: forming a drive transistor over the substrate, wherein the drive transistor controls the luminance of the organic light emitting device.

12. The method of claim 8, wherein the reflective layer has a reflective surface facing the organic light emitting device, and directing light from the organic light emitting device toward the second opening.

* * * * *